US009312169B2

(12) United States Patent  
Bouvier et al.

(10) Patent No.: US 9,312,169 B2  
(45) Date of Patent: Apr. 12, 2016

(54) INTERCONNECTION OF SEVERAL LEVELS OF A STACK OF SUPPORTS FOR ELECTRONIC COMPONENTS

(71) Applicant: COMMISSARIAT A L'ENERGIE ATOMIQUE ET AUX ENE ALT, Paris (FR)

(72) Inventors: Christophe Bouvier, Grenoble (FR); Gabriel Pares, Bernin (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/454,023

(22) Filed: Aug. 7, 2014

(65) Prior Publication Data

US 2015/0044866 A1    Feb. 12, 2015

(30) Foreign Application Priority Data

Aug. 9, 2013   (FR) ...................... 13 57933

(51) Int. Cl.
| | |
|---|---|
| *H01L 21/30* | (2006.01) |
| *H01L 21/768* | (2006.01) |
| *H01L 23/12* | (2006.01) |
| *H01L 23/52* | (2006.01) |
| *H01L 23/552* | (2006.01) |
| *H01L 25/065* | (2006.01) |

(Continued)

(52) U.S. Cl.
CPC .... *H01L 21/76838* (2013.01); *H01L 21/76898* (2013.01); *H01L 23/552* (2013.01); *H01L 24/19* (2013.01); *H01L 24/24* (2013.01); *H01L 24/82* (2013.01); *H01L 24/92* (2013.01); *H01L 24/96* (2013.01); *H01L 25/0652* (2013.01); *H01L 25/0657* (2013.01); *H01L 25/50* (2013.01); *H01L 23/5389* (2013.01); *H01L 27/0688* (2013.01); *H01L 2224/04105* (2013.01); *H01L 2224/24137* (2013.01); *H01L 2224/24145* (2013.01); *H01L 2224/9202* (2013.01); *H01L 2225/06513* (2013.01); *H01L 2225/06537* (2013.01); *H01L 2225/06541* (2013.01); *H01L 2225/06548* (2013.01); *H01L 2924/12042* (2013.01)

(58) Field of Classification Search
None
See application file for complete search history.

(56) References Cited

U.S. PATENT DOCUMENTS

| 5,552,633 A | 9/1996 | Sharma |
|---|---|---|
| 7,618,846 B1 | 11/2009 | Pagaila et al. |

(Continued)

FOREIGN PATENT DOCUMENTS

| EP | 2 053 646 B1 | 8/2010 |
|---|---|---|
| EP | 2 498 287 A2 | 9/2012 |

OTHER PUBLICATIONS

French Preliminary Search Report issued May 27, 2014, in Patent Application No. FR 1357933, filed Aug. 9, 2013 (with English Translation of Category of Cited Documents).

(Continued)

*Primary Examiner* — Pamela E Perkins
(74) *Attorney, Agent, or Firm* — Oblon, McClelland, Maier & Neustadt, L.L.P.

(57) ABSTRACT

Method for producing a microelectronic device formed from a stack of supports (W) each provided with one or more electronic components (C) and comprising a conductive structure (170, 470) formed from a first blind conductive via (171b, 472) and a second blind conductive via (171a, 473) with a greater height, the first via and the second via being connected together.

12 Claims, 8 Drawing Sheets

(51) Int. Cl.
*H01L 25/00* (2006.01)
*H01L 23/00* (2006.01)
*H01L 27/06* (2006.01)
*H01L 23/538* (2006.01)

(56) References Cited

U.S. PATENT DOCUMENTS

| | | |
|---|---|---|
| 2003/0193076 A1 | 10/2003 | Patti |
| 2007/0013058 A1 | 1/2007 | Choi et al. |
| 2009/0013519 A1* | 1/2009 | Park et al. ............... 29/594 |
| 2009/0260228 A1 | 10/2009 | Val |
| 2009/0294814 A1 | 12/2009 | Assefa et al. |
| 2010/0019359 A1 | 1/2010 | Pagaila et al. |
| 2011/0298101 A1 | 12/2011 | Pagaila et al. |
| 2012/0013012 A1 | 1/2012 | Sadaka et al. |
| 2012/0018879 A1 | 1/2012 | Shin et al. |
| 2012/0231624 A1* | 9/2012 | Barthelot et al. ............. 438/637 |
| 2013/0105949 A1 | 5/2013 | Sasaki et al. |
| 2014/0144690 A1 | 5/2014 | Pares |

OTHER PUBLICATIONS

Patrick Leduc, et al., "Challenges for 3D IC integration: bonding quality and thermal management", IEEE International Interconnect Technology Conference, XP 031111816, Jun. 2007, pp. 210-212.

European Search Report issued Mar. 27, 2015 in Patent Application No. 14180064.9 (with English translation of categories of cited documents).

Patrick Leduc, et al., "Challenges for 3D IC integration: bonding quality and thermal management" IEEE International Interconnect Technology Conference, XP031111816, Jun. 2007, pp. 210-212 (reference previously filed, submitting Statement of Relevancy only).

\* cited by examiner

INTERCONNECTION OF SEVERAL LEVELS OF A STACK OF SUPPORTS FOR ELECTRONIC COMPONENTS

TECHNICAL FIELD

The invention relates to the field of microelectronic devices of the so-called "3D" type formed from various superimposed levels of microelectronic supports such as wafers, cards, substrates and chip assemblies, and concerns more precisely a method for producing a structure for connection between various levels of a superimposition of microelectronic supports.

It provides for the fabrication of a connection structure for a 3D microelectronic device, formed from blind conductive vias having an improved arrangement, and applies in particular to devices comprising an encapsulation (also referred to as "packaging").

PRIOR ART

In order to increase the density of integration of components in a microelectronic device, producing devices formed from an assembly of several superimposed supports (substrates, wafers, cards) each provided with one or more electronic components such as integrated circuits or chips is known.

The components of such a device can be interconnected in three dimensions, for example using the lateral faces of the stack of supports.

In order to reduce the space requirement for the connections, producing structures commonly referred to as "vias" passing through a stack of microelectronic supports is also known.

The document "Challenges for 3D IC integration: bonding quality and thermal management", by Leduc et al, IEEE 2007, presents a connection structure for connecting together components belonging to different levels in a superimposition of microelectronic supports.

The problem is posed of finding an improved method for producing such a structure.

DISCLOSURE OF THE INVENTION

An embodiment of the present invention concerns first of all a method for producing a microelectronic device, comprising steps of:
a) producing, from an assembly of stacked supports, each provided with one or more electronic components, a plurality of blind holes through a face referred to as the "front face" of the stack, including at least one first blind hole passing through a first support in the stack, and at least one second blind hole with a height greater than that of the blind hole and passing through said first support and a second support,
b) deposition of a conductive material in said first blind hole, said second blind hole and on a given region of said front face of said stack.

Advantageously, between step a) and step b), a masking is formed on said face of the stack comprising an opening uncovering said first blind hole, said second blind hole, and the given region situated between the first blind hole and the second blind hole.

In this way a conductive structure is formed comprising a first conductive element covering the bottom of the blind hole and connected, by means of a conductive portion disposed on said given region, to a second conductive element covering the bottom of the second blind hole.

By virtue of the formation of the masking comprising an opening, the formation of the conductive structure is carried out without necessarily having to subsequently etch this material.

The deposition of the conductive material at step b) in such an opening is performed simultaneously, in the first blind hole, the second blind hole and the given region.

It is thus possible to limit the number of steps for producing this interconnection structure.

Said electronic components may be chips or integrated circuits.

The first conductive element and the second conductive element may form respectively a first blind conductive via partially passing through the stack, and a second blind conductive via partially passing through the stack and with a greater height than that of the first conductive via.

It is thus possible to produce a connection in pairs of components situated at various levels in a superimposition of supports, or situated on different supports.

The conductive portion connecting the first conductive element and the second conductive element may be a connection zone of the RDL type (RDL standing for "redistribution layer").

The assembly may comprise at least three supports, said first support and said second support then being stacked on a third support.

Said supports in the stack may be covered with at least one encapsulation layer.

Thus the method according to the invention is adapted in particular to stacks of supports previously having been subjected to a step commonly referred to as "packaging" or encapsulation.

The encapsulation layer of the supports may be based on composite material formed from a polymer material containing mineral particles.

In this case, the blind holes are produced by etching this composite material.

Advantageously, the blind holes may be formed by piercing by means of a laser. Such a method makes it possible to obtain good selectivity of etching and to form holes having a precise profile, and is adapted particularly to producing holes in a heterogeneous stack, comprising in particular a composite material.

Step a) of producing blind holes can be performed by etching the supports with stoppage of etching respectively on said first conductive zone and on said second conductive zone.

Advantageously, the first blind hole reveals a first conductive zone situated in said stack while the second blind hole revealed a second conductive zone situated in said stack.

The first conductive zone can be connected to at least one electronic component such as a chip or an integrated circuit.

The second conductive zone can also be connected to at least one other electronic component, for example another chip or another integrated circuit.

Said first and second conductive zones can advantageously serve as an etching stop zone when the blind holes are produced.

According to one possibility of implementing the method, step a) may comprise the formation of a blind hole passing through a face referred to as the "front face" of at least one given support from among said supports, said given support having a bottom and covering a conductive zone disposed on a face referred to as the "rear face" of said given support, opposite to said front face of said given support.

According to a possible implementation, at step a), blind holes having a splayed shape may be formed. This then facilitates the filling of the holes at step b).

According to one possible implementation at step a), the second blind hole can be produced with a transverse section larger than the transverse section of the first blind hold.

The supports may be assembled prior to step a) by means of one or more adhesive bonding layers.

According to a particular possible implementation of the method, at step a), at least one of the blind holes may be formed by a trench implementing a closed contour.

This subsequently makes it possible, when this trench is filled in at step b), to form a closed conductive chamber.

According to another aspect, a microelectronic device is provided and formed by a stack of supports each provided with one or more electronic components and comprising a conductive structure formed by at least one first conductive element extending between a given face of said stack and a first conductive zone situated at a first height in the said stack and at least one second conductive element extending between said given face of said stack and a second conductive zone situated at a second height in said stack, said first and second conductive elements being connected together by means of a conductive portion disposed between them on a given region of said given face of said stack.

Advantageously, the device may comprise another conductive element extending in said stack between said given face of said stack and a conductive zone disposed in said stack opposite a given electronic component, said other conductive element being arranged so as to form a continuous enclosure around said given component.

This conductive enclosure may make it possible to form, for the given component, protection against RF waves or a heat dissipation zone.

BRIEF DESCRIPTION OF THE DRAWINGS

The present invention will be understood better from a reading of the description of given example embodiments, purely by way of indication and in no way limitatively, with reference to the accompanying drawings, wherein.

Identical, similar or equivalent parts in the various figures bear the same numerical references so as to facilitate passing from one figure to another.

The various parts depicted in the figures are not necessarily shown to a uniform scale, to make the figures more legible.

DETAILED DISCLOSURE OF PARTICULAR EMBODIMENTS

Figure 1A:
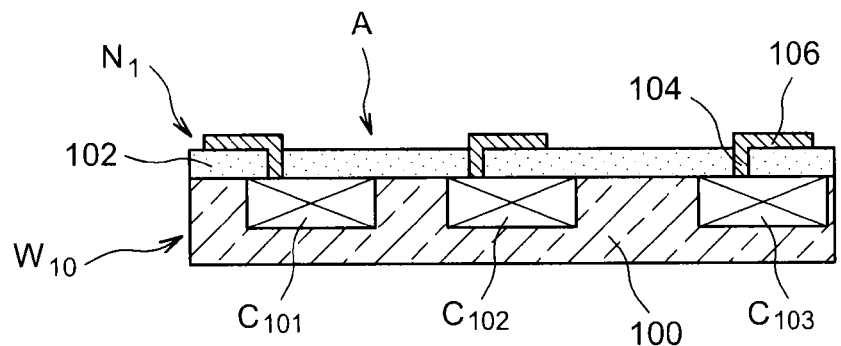
FIGS. 1a, 1b, 1c illustrate various examples of supports able to be integrated in a microelectronic device produced according to an embodiment of the invention.
Figure 1B:
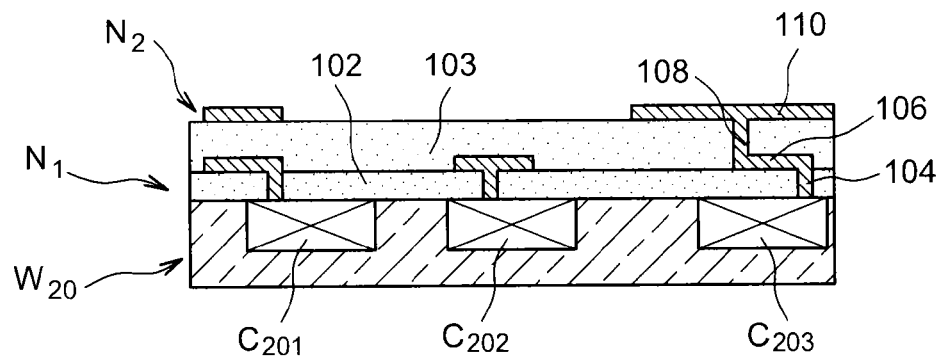
Figure 1C:
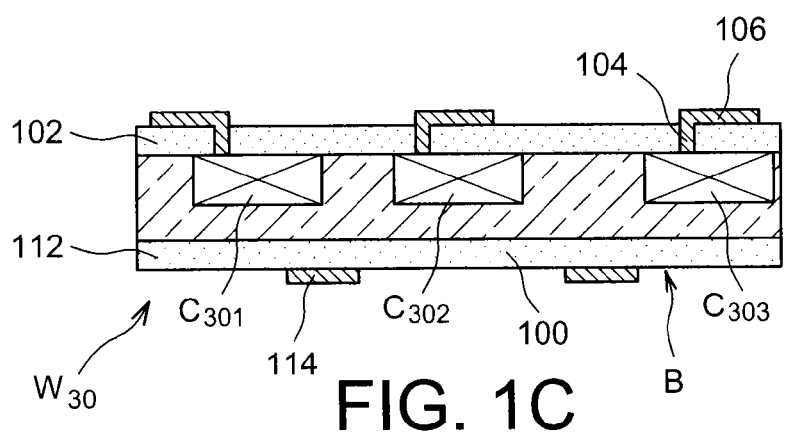

Reference is made first of all to FIGS. 1A to 1C, illustrating various types of microelectronic support, such as for example wafers $W_{10}$, $W_{20}$, $W_{30}$ able to be assembled within a microelectronic device according to the invention.

These wafers may each be formed by a substrate 100, which may be semiconductive, for example based on silicon or GaAs, or in a variant be made from polymer and have been reconstituted for example by moulding an epoxy matrix or by laminating polymer.

The wafers $W_{10}$, $W_{20}$, $W_{30}$ are each provided with one or more chips $C_{101}$, $C_{102}$, $C_{103}$, or $C_{201}$, $C_{202}$, $C_{203}$, or $C_{301}$, $C_{302}$, $C_{303}$, and have a thickness (the dimension along the axis z in FIG. 1A) of between for example 10 and 1000 µm, for example around 100 µm.

The wafers $W_{10}$, $W_{20}$, $W_{30}$ are covered on one of the faces thereof, referred to as the "front face" A, with an encapsulation layer 102, based on a given material different from that of the substrate 100, the given material preferably being insulating, such as a ceramic material, or a material of the SOG type (SOG standing for "spin on glass") or a composite material, which may be organic and formed from at least one polymer containing mineral particles. For example, the composite material is an epoxy material or silicone containing dielectric particles such as silicon or aluminium oxide.

The given material may optionally be photosensitive.

The encapsulation layer 102 thus fulfils the role of a passivation layer and may have a thickness of between for example 1 µm and 50 µm.

The chips $C_{101}$, $C_{102}$, $C_{103}$ may each be connected to at least one conductive connection zone of the RDL type (RDL standing for "redistribution layer") formed for example from at least one conductive zone 104 passing through the encapsulation layer 102 and connected to another conductive zone 106 extending over the encapsulation layer 102 parallel to the principal plane of the substrate 100 (defined here as a plane passing through the substrate and parallel to the plane [O,z,y] in FIG. 1A).

A wafer may, like the one referenced $W_{20}$ in FIG. 1B, comprise several superimposed encapsulation layers 102, 103, wherein respectively a first connection level $N_1$ of the RDL type and a second connection level $N_2$ of the RDL type are disposed. The second connection level $N_2$ may then be connected to the first level $N_1$ and be formed for example by at least one conductive zone 108 passing through another encapsulation layer 103 of the same type as the layer 102 and connected to another conductive zone 110 extending parallel to the substrate 100 on this other encapsulation layer 103.

A wafer may, as in the example in FIG. 1C, comprise an encapsulation layer 112 on its so-called "rear" face B, opposite the front face. This layer 112 may be of the same nature as the layers 102 and 103. In this example, the rear face is also provided with conductive elements 114 that are not connected to a chip and may be designed for example to make a connection to one or more passive components such as one or more inductors and/or one or more capacitors and/or one or more resistors.

In order to form a 3D microelectronic device, it is possible to produce first of all an assembly of wafers of the same type for example as those that have just been described, which are superimposed or stacked.

Figure 2:
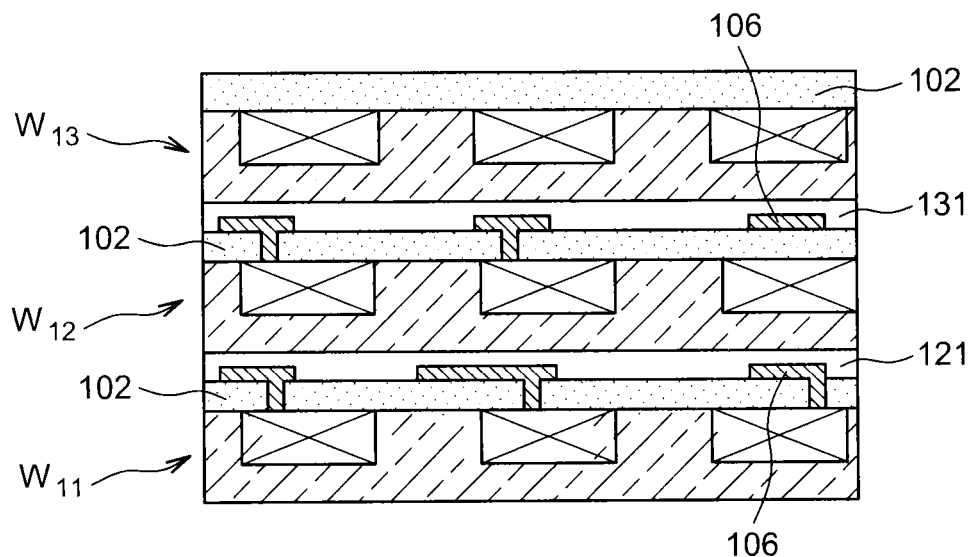
FIG. 2 illustrates an example of the assembly of supports able to serve as a starting element for a method according to an embodiment of the invention.

An example of an assembly of wafers comprising wafers $W_{11}$, $W_{12}$ of a first type, for example the one illustrated in FIG. 1A, as well as at least one wafer $W_{13}$ of another type, is given in FIG. 2.

This assembly is here is done by adhesive bonding of the plates $W_{11}$, $W_{12}$ and $W_{13}$ with each other, these being fixed in pairs by means of sealing layers 121, 131, also referred to as bonding layers.

The sealing layers 121, 131 have adhesive properties and may be based on a material different from that of the encapsulation layers 102. The adhesive material used may be polymer, for example such as BCB (benzocyclobutene), or an epoxy polymer, optionally photosensitive, such as for example SU8.

The sealing layers 121, 131 may be produced so as to encapsulate the conductive elements 106 of an RDL connection level and thus fulfil the role of a passivation layer and/or form a supplementary passivation layer.

Blind holes are then formed (FIGS. 3, 4, 5, 6, 7) for example in the form of trenches or openings in the stack of assembled wafers.

There is thus produced, through the front face of a first given wafer situated at one end of the stack, in particular at the top of the stack, at least one first blind hole passing through the thickness of the first wafer as well as at least one second blind hole passing through the thickness of the first wafer and at least one second wafer, up against the first wafer, and on which the first wafer rests.

"Blind" holes means that these holes do not pass right through the thickness of the stack. Unlike completely traversing holes, the blind holes have a bottom situated in the thickness of the stack and reveal a region of the latter.

Figure 3:
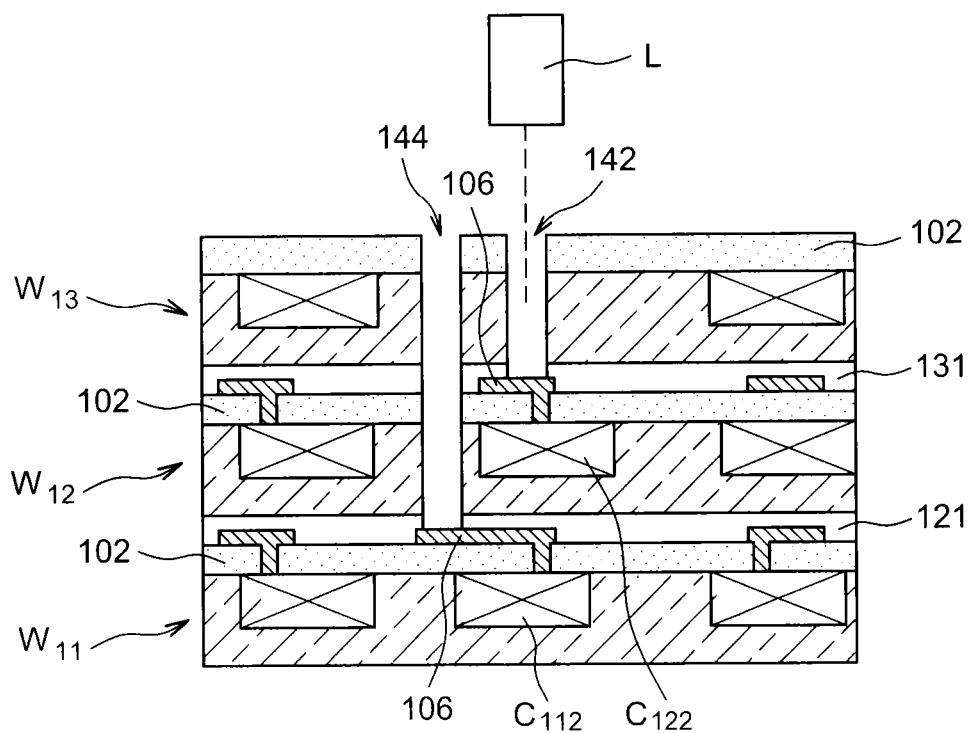
FIGS. 3, 4, 5 illustrate an embodiment of blind holes with various depths in various examples of a stack of supports, with a view to producing conductive vias with different heights in these stacks.

In a first example embodiment illustrated in FIG. 3, blind holes 142, 144, passing respectively through the wafer $W_{13}$ and the stack of wafers $W_{13}$ and $W_{12}$, are produced.

The first blind hole 142 passes through an encapsulation layer 102 formed on the top face of the substrate 100 of the first wafer $W_{13}$, passes through this substrate 100, as well as the sealing layer 131 between the first wafer $W_{13}$ and the second wafer $W_{12}$, until it reaches the encapsulation layer 102 covering the second wafer $W_{12}$. The bottom of the first blind hole 142 reveals a conductive zone 106, in particular a connection zone of the RDL type connected to a chip $C_{122}$ of the second wafer $W_{12}$.

The second blind hole 144 passes through the encapsulation layer 102 of the first wafer $W_{13}$, the substrate 100 of the first wafer $W_{13}$, the sealing layer 131 between the first wafer $W_{13}$ and the second wafer $W_{12}$, the encapsulation layer 102 of the second wafer $W_{12}$, the substrate 100 of the second wafer $W_{12}$, and the sealing layer 121 between the second wafer $W_{12}$ and the third wafer $W_{11}$ until it reaches the encapsulation layer 102 covering the third wafer $W_{11}$. The bottom of the second blind hole 144 reveals a conductive zone 106, in particular a connection zone of the RDL type connected to a chip $C_{122}$ of the third wafer $W_{11}$.

In order to form the holes 142, 144, a laser L can advantageously be used in order to obtain good precision with regard to their profile and the stoppage of etching.

A laser in the infrared range may be used so as to make it possible to obtain good selectivity of etching. In a variant, implementation using a laser emitting in the UV range may make it possible to obtain a more precise hole profile.

Figure 6:
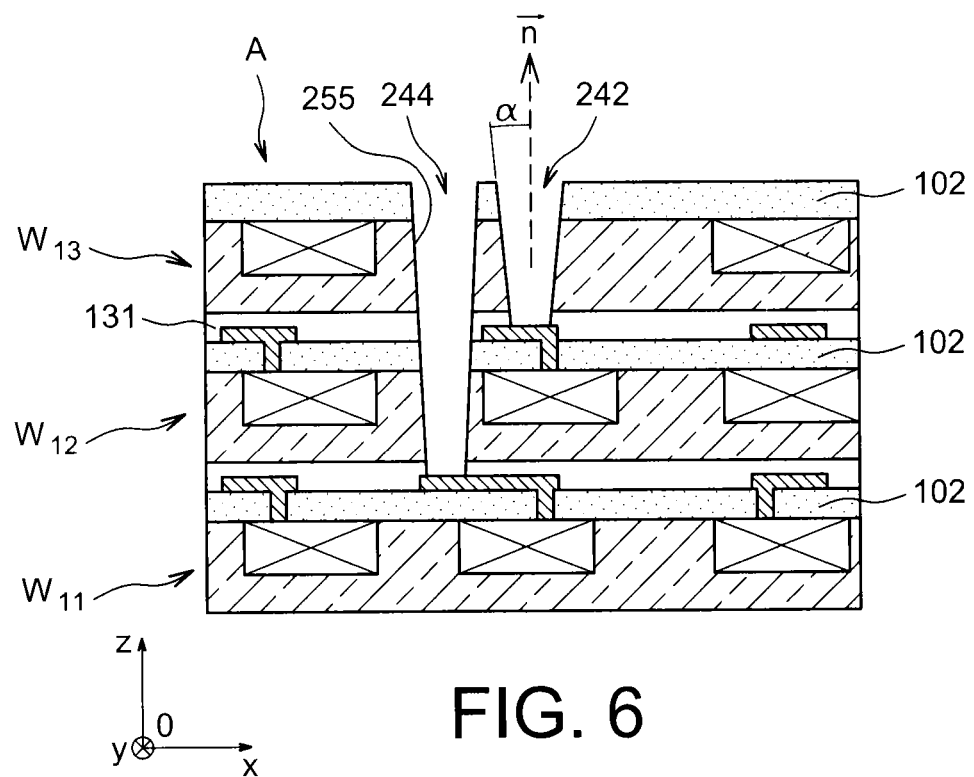
FIG. 6 illustrates an embodiment of blind holes with a splayed form, with a view to producing conductive vias having a base and a top broadened with respect to this base.

The use of a laser also makes it possible to produce various hole profiles, and optionally to use holes the walls of which are inclined, as in the example embodiment in FIG. 6, for which holes 242, 244 with a splayed profile have been formed and comprise walls 255 producing an angle α for example between 75° and 85°, with respect to a normal $\vec{n}$ to the principal plane of the wafers (i.e. a plane passing through a wafer $W_{11}$ or $W_{12}$ or $W_{13}$ and parallel to the plane [O,x,y] in FIG. 6).

The holes 142, 144 or 242, 244 are thus pierced opposite regions comprising conductive zones, for example metal, able to serve as stop layers for the laser etching. The use of an infrared laser then makes it possible to obtain good etching selectivity, in particular when the conductive zones are based on a metal such as copper.

Figure 4:
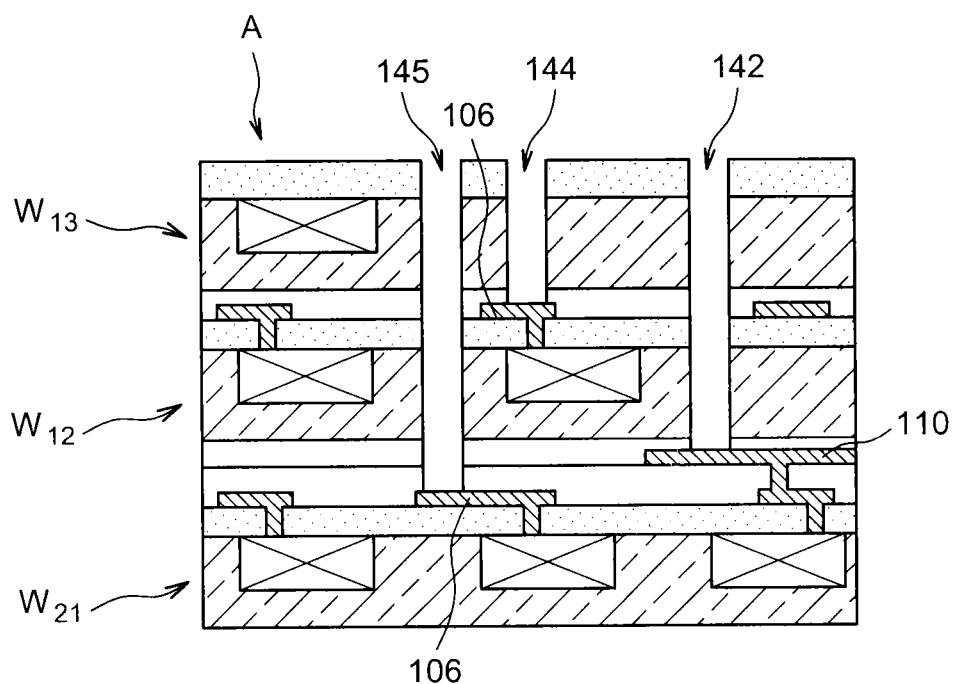

In the example in FIG. 4, holes 142, 144, 145 are produced through an assembly comprising a first wafer $W_{12}$ and a second wafer $W_{13}$ of the same type as that in FIG. 1A, as well as a third wafer $W_{21}$ of the same type as in FIG. 1B.

A first blind hole 142 passes through the first wafer $W_{13}$ and comprises at the bottom a connection zone of the RDL type connected to a component or set of components of a second wafer $W_{12}$.

A second blind hole 144 for its part passes through the first wafer $W_{13}$ and the second wafer $W_{12}$ and is provided with a bottom wherein a conductive zone 110 of a second connection level of the RDL is revealed, this conductive zone 110 being connected to a component or a set of components of the third wafer $W_{22}$.

A third blind hole 145 passes through the first wafer $W_{13}$ and the second wafer $W_{12}$ and comprises at the bottom a conductive zone 106 of a first connection level of the RDL type, this conductive zone being connected to a component or set of components of the third wafer $W_{22}$.

Figure 5:
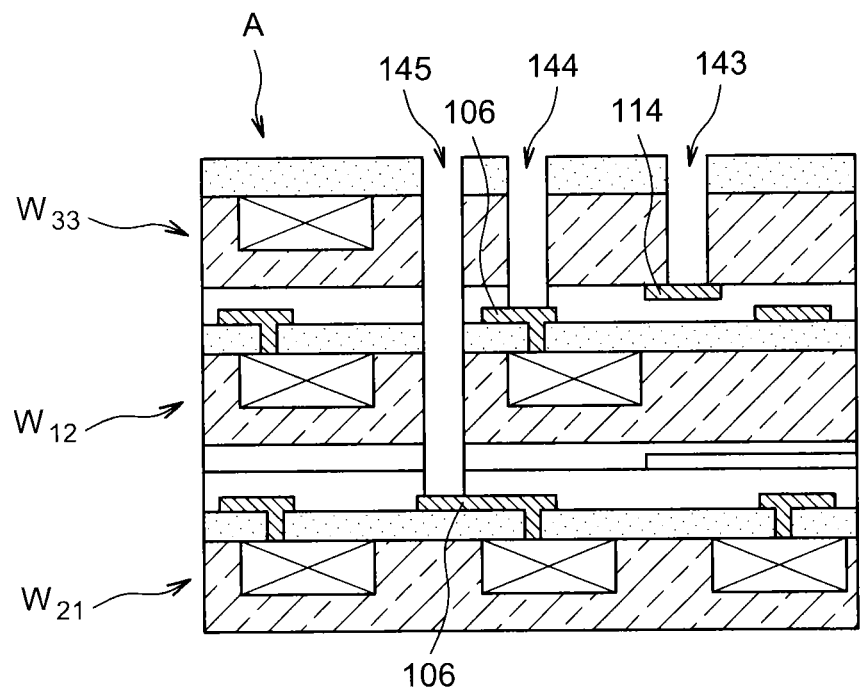

Another example of a stack is given in FIG. 5. The stack wherein blind holes 143, 144, 145 are produced this time comprises a first wafer $W_{33}$ of the type illustrated in FIG. 1C resting on a second wafer $W_{12}$ of the type illustrated in FIG. 1A, itself resting on a third wafer $W_{21}$ of the type illustrated in FIG. 1B. A first blind hole 143 is produced through the first wafer $W_{33}$ and opposite a conductive zone 114 disposed on the rear face of the first wafer $W_{33}$, a second blind hole 144 with a depth greater than that of the first blind hole 143 is produced through the first wafer $W_{33}$ and opposite a conductive zone 106 disposed on the front face of the wafer $W_{12}$. A third blind hole 145 with a depth greater than that of the holes 143, 144 is produced through the first wafer $W_{33}$ and the second wafer $W_{12}$ opposite a conductive zone 106 disposed on the front face of the third wafer $W_{21}$.

The blind holes 142, 143, 144, 145 produced may have a diameter of around several tens of micrometers, for example around 90 μm.

Figure 7:
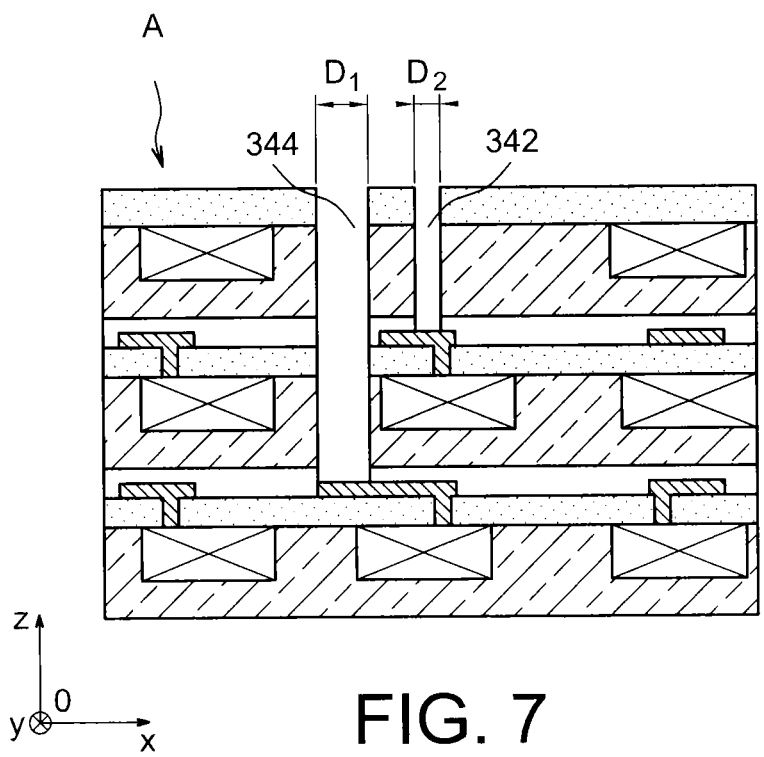
FIG. 7 illustrates an embodiment of blind holes with different diameters and adapted according to respective depths of the holes, with a view to producing conductive vias of different sizes.

In the embodiment illustrated in FIG. 7, holes 342, 344 are provided with transverse sections D1, D2 of different dimensions (defined of sections measured in a plane parallel to the plane [O,x,y] in FIG. 7) according to the level wherein their respective bottoms are situated in the stack of wafers.

A blind hole 342 of given depth in the assembly may be provided for example with a transverse section $D_1$, while another blind hole 344 of greater depth is provided with a transverse section $D_2$ such that $D_2 > D_1$.

The resistance of conductive vias intended to be formed in these holes can thus be adapted according to their depth.

Thus it is possible to use the connection resistor according to the dimensions of the hole so as to produce impedance matching, in particular in the RF domain.

After having produced the blind holes, a connection structure is then formed comprising conductive vias of different heights connected together by means of a conductive zone extending over the top face of the stack of wafers corresponding to the top face of the first wafer, that is to say the one situated at the top of the assembly.

An example of implementation of such a connection structure is illustrated in FIGS. 8A-8E, taking for example as the starting material the assembly wafers $W_{21}$, $W_{12}$, $W_{13}$, in FIG. 4 wherein blind holes 142, 144, 145 are produced, for example by laser piercing or by means of plasma etching.

Figure 8A:
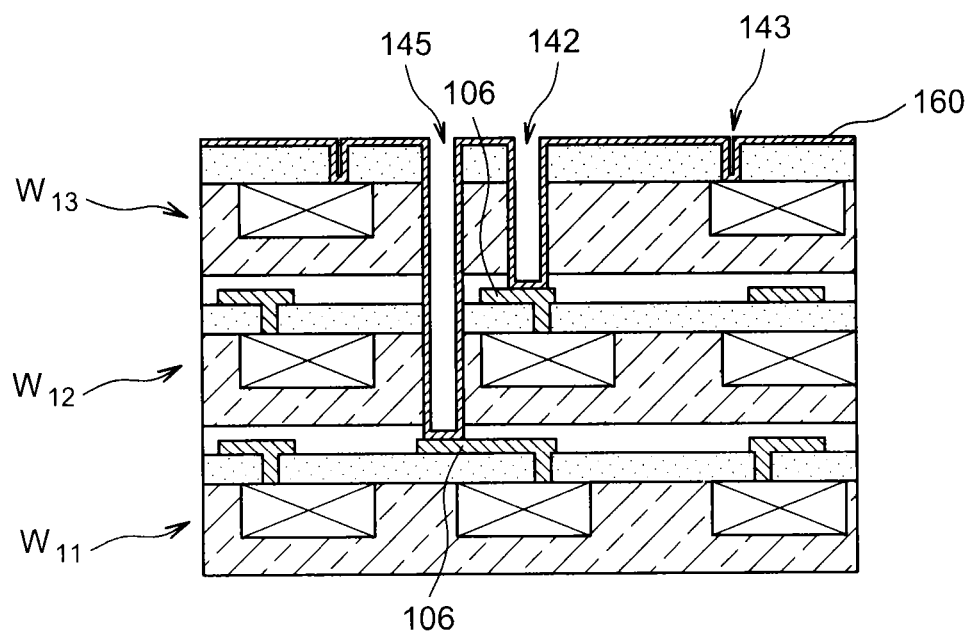
FIGS. 8A-8E illustrate a method for producing a conductive structure in an assembly of superimposed supports, said conductive structure comprising conductive vias of different heights connected together and arranged so as to connect the elements of the assembly situated at different levels on the assembly.

A deposition of a layer 160 is first of all effected, serving as an electrolytic germination layer and optionally as a diffusion barrier layer in the blind holes 142, 144, 145 and on the top face of the assembly of wafers (FIG. 8A).

This layer 160 may for example be formed from a sub-layer of Ti, for example of around several hundreds of manometers, and a sub-layer of Cu, for example of around several hundreds of manometers. The layer 160 may be produced for example by PVD (physical vapour deposition) or iPVD (ionised physical vapour deposition) or CVD (chemical vapour deposition) at low temperature, for example below 200° C.

Figure 8B:
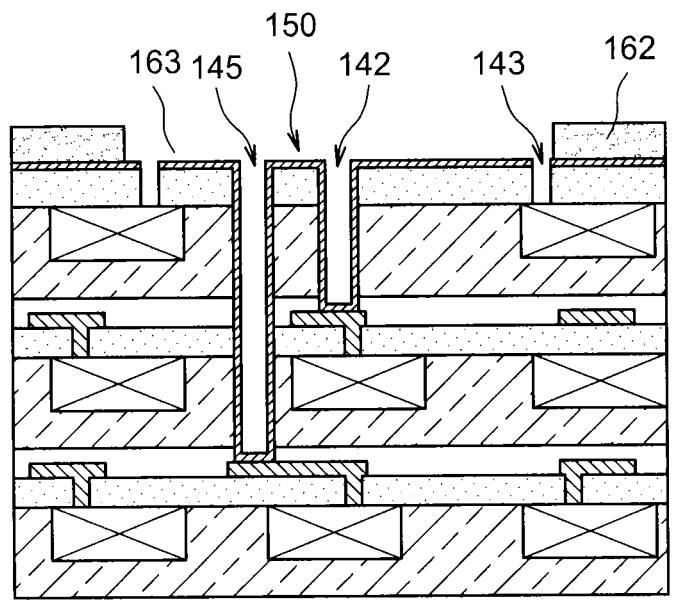

A masking 162 is next carried out on the front face of the stack of wafers $W_{13}$, $W_{12}$, $W_{21}$, for example by photolithography of a layer of photosensitive resin, the masking comprising at least one opening 163 revealing a region 150 of the front face of the first wafer $W_{13}$, as well as the blind holes 142, 144, 145 (FIG. 8B).

Then a conductive structure 170 covering the flanks on the bottom of the blind holes 142, 143, 145 as well as zones of the top face of the wafer $W_{13}$ at the top of the stack is formed, for example by metal deposition by electrolysis. In the opening 163, the region 150 and the blind holes 142, 144, 145 are filled in simultaneously with metal material (FIG. 8C).

The conductive structure 170 may be based on copper and have a thickness for example of around several microns, typically between 1 μm and 20 μm.

Figure 8C:
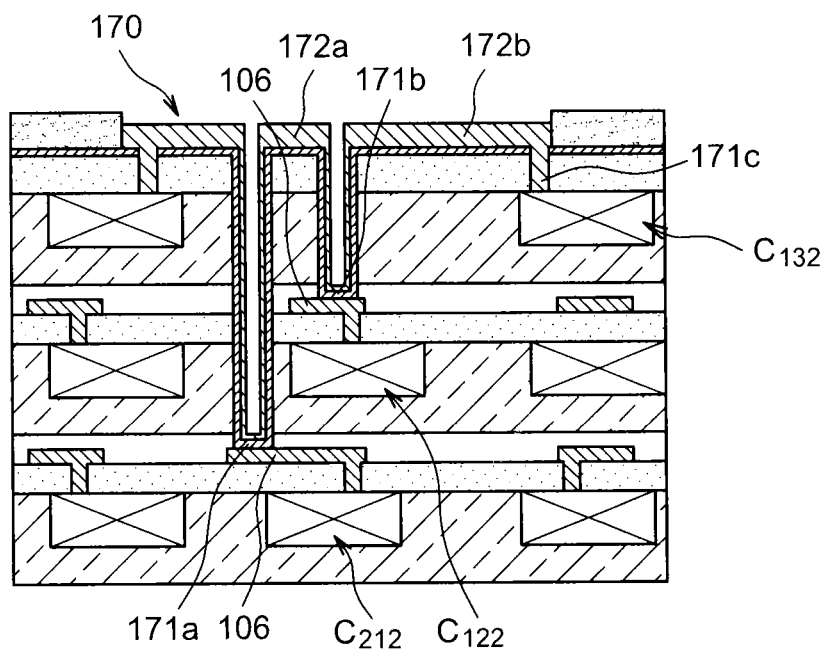

The conductive structure 170 produced comprises a first conductive zone 171a covering the bottom of the blind hole 145, connected to a second conductive zone 172a covering a region of the top face of the stack, itself connected to a third conductive zone 171b reaching the bottom of another blind hole 142, this third conductive zone 171b itself being connected to a fourth conductive zone 172b disposed between this other blind hole 142 and a blind hole 143 at the bottom of which a fifth conductive zone 171c connected to the fourth conductive zone 172b is formed (FIG. 8C).

The conductive zones 171a, 171b are formed on and in contact with connection zones 106 of the RDL type themselves connected respectively to a chip $C_{212}$ of the support $W_{21}$ situated at the base of the stack, to a chip $C_{122}$ of the support $W_{21}$ situated at another level in the stack, and to a chip $C_{132}$ of the support $W_{13}$ situated at a level of the stack different from the level at which the chips $C_{212}$ and $C_{122}$ are situated.

In a variant, the conductive zones 171a, 172a, 171b, 172b, 171c can be produced by deposition of metallic ink according to a method of the inkjet type, containing metal nanoparticles, for example silver or copper.

According to another variant, the mixed method using ECD deposition and metallic ink deposition, before or after the production of the layer 160, can be implemented in order to improve the conformity of the layer on which the ECD deposition is carried out.

The masking 162 is then removed.

Figure 8D:
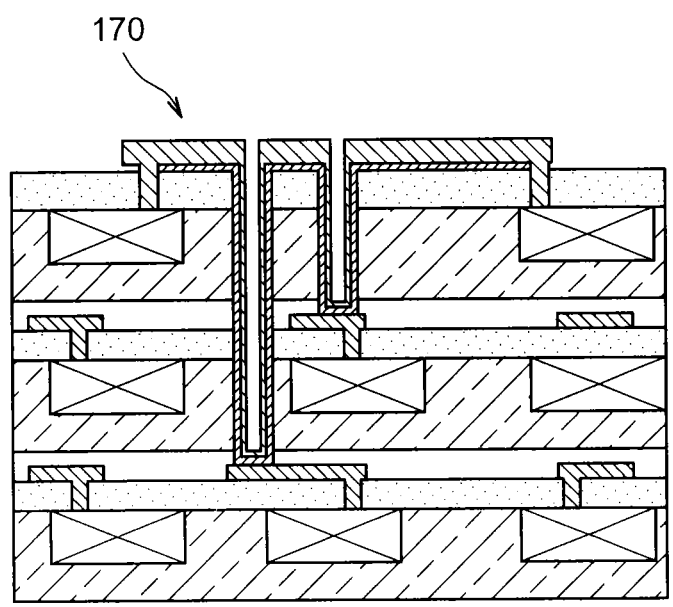

Then the layer 160 serving as a catalytic germination layer can be removed from the top face of the stack by etching (FIG. 8D).

Figure 8E:
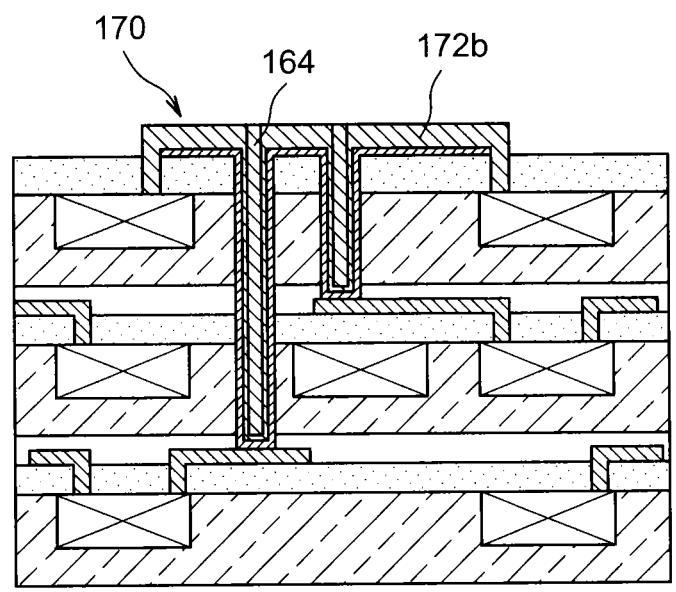

The production of the vias can then be completed by deposition of a metal material 164 completing the filling of the blind holes. The structure produced is thus formed from blind metallised vias connected together by means of one or more conductive portions covering the wafer $W_{13}$ disposed at the top of the superimposition of wafers $W_{21}$, $W_{12}$, $W_{13}$ (FIG. 8E).

The metal material 164 can also be formed by means of a deposition of the inkjet type.

Figure 9A:
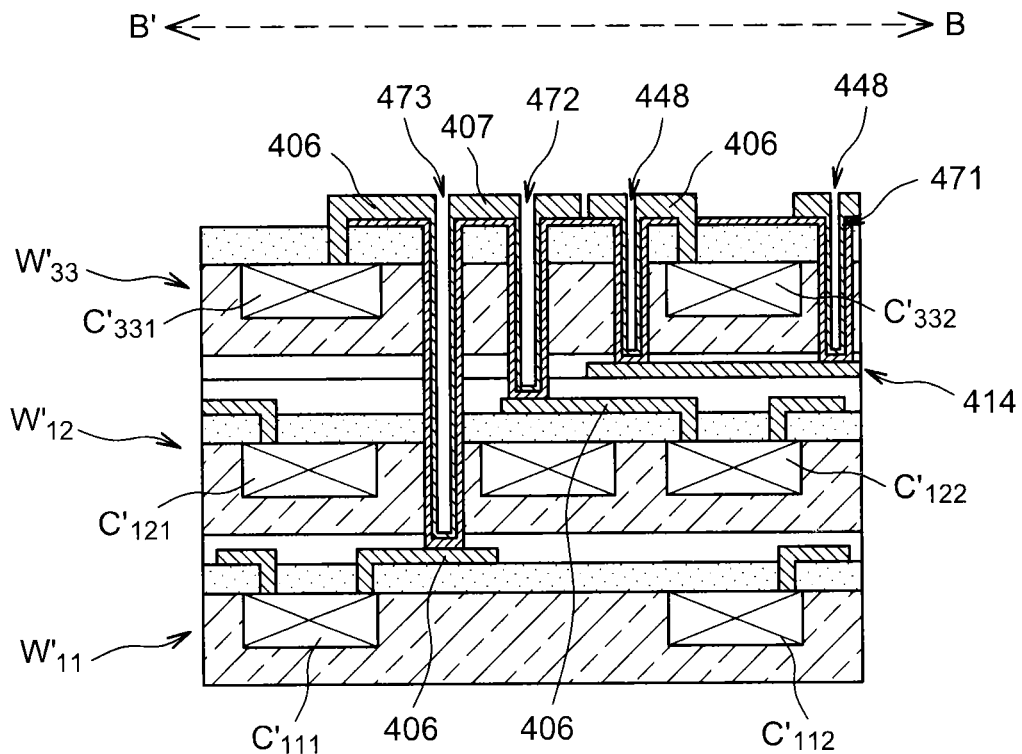
FIGS. 9A-9B illustrate an example embodiment of a device with superimposed supports provided with a conductive structure formed by conductive vias with different heights connected together as well as a conductive element passing through the thickness of a support and forming a conductive enclosure around a chip of this support.
Figure 9B:
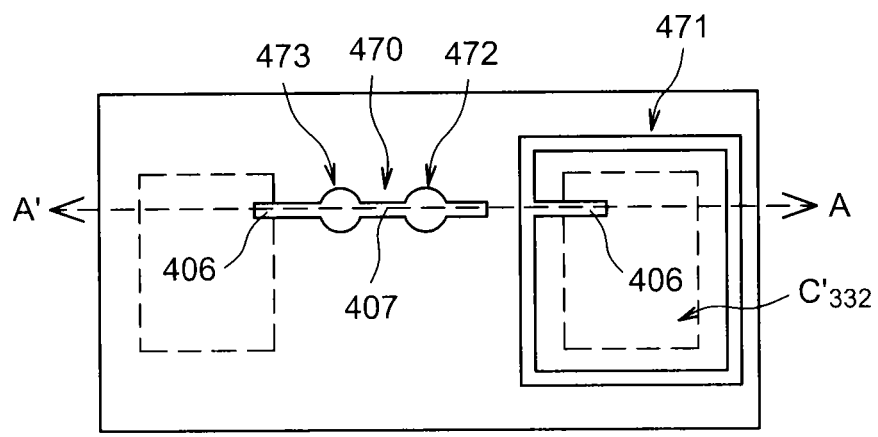

In FIGS. 9A-9B, another example of an embodiment of a microelectronic device formed from superimposed supports is illustrated (respectively in a view in transverse section parallel to an axis B'B and in a plan view).

This device comprises an assembly of superimposed supports $W'_{11}$, $W'_{12}$ and $W'_{33}$ provided respectively with chips $C'_{111}$, $C'_{112}$, $C'_{121}$ and $C'_{122}$, $C'_{331}$, $C'_{332}$.

In a support $W'_{33}$, a blind hole in the form of a trench 448 passes through the support $W'_{33}$ and surrounds a chip $C'_{332}$ so as to reach a conductive zone 414 disposed on the rear face of the support $W'_{33}$, opposite the chip $C'_{332}$. The blind hole 448 in the form of a trench produces a closed contour.

A conductive zone 471, for example based on metal, covering the bottom and the vertical walls of this blind hole 448, is thus arranged so as to form a conductive partition or a conductive wall or a closed conductive enclosure around the chip $C'_{332}$. This conductive zone 471 can function as a shielding zone or a Faraday cage, in particular when the device comprises RF components. This conductive zone 471 can also fulfil the function of heat dissipation zone.

In this example, the conductive zone 471 is connected to the conductive zone 414 disposed on the rear face of the support $W'_{33}$ and to a connection zone 406 of the RDL type, itself connected to the chip $C'_{332}$. The conductive zone 471 may optionally be electrically connected to the mass of the chip $C'_{332}$.

The device also comprises a conductive via 472 passing partially through the assembly and connected to another conductive via 473 passing through the support $W'_{33}$ and with a height less than that of the via 472. The conductive via 472 makes a connection between chips $C'_{331}$ and $C'_{111}$ situated at different stages in the stack of supports $W'_{11}$, $W'_{12}$, $W'_{33}$. For this purpose the via 472 can be connected to conductive zones 206 of the RDL type, themselves connected to the chips $C'_{331}$, and $C'_{111}$.

The conductive via 473 for its part makes a connection with a chip $C'_{122}$ situated at a stage in the superimposition of supports $W'_{11}$, $W'_{12}$, $W'_{33}$ of those where the chips $C'_{331}$ and $C'_m$ are situated.

A connection between the vias 472 and 473 is made by means of a conductive zone 407 arranged on the support $W'_{33}$.

Thus the chip $C'_{111}$ situated at a first level in the stack of supports, the chip $C'_{122}$ situated at a second level in the stack of supports and the chip $C'_{331}$ situated at the third level in the stack of supports are interconnected.

The example embodiments that have been given in relation to FIGS. 1 to 9 provide for assemblies of 3 stacked supports, but a method according to the invention can apply to the implementation of an assembly of more than 3 supports.

The invention claimed is:

1. Method for producing a microelectronic device comprising steps of:
   providing an assembly of stacked supports including a first support and a second support on the first support, each support provided with one or more electronic components, and forming a stack having a front face;

forming a plurality of blind holes through the front face of the stack, including at least one first blind hole passing only through said first support, and at least one second blind hole passing through said first support and through said second support;

after forming the blind holes forming a masking on said front face of the stack, the masking comprising at least one opening revealing the first blind hole, the second blind hole and a region of the front face of the stack that extends from the first blind hole to the second blind hole; and after forming the masking, depositing conductive material simultaneously in the first blind hole, the second blind hole and on the region of the front face, so as to form a conductive structure comprising a first conductive element covering the bottom of the first blind hole and a second conductive element covering the bottom of the second blind hole, said first and second conductive elements being connected together by a conductive portion disposed on said region of the front face.

2. Method according to claim 1, wherein the assembly comprises at least three stacked supports, the first and second supports being stacked on a third support.

3. Method according to claim 1, wherein the first blind hole reveals a first conductive zone and wherein the second blind hole reveals a second conductive zone, said first conductive zone and/or said second conductive zone being connected to at least one electronic component.

4. Method according to claim 3, wherein said step of forming blind holes comprises etching said supports with stoppage of the etching on said first conductive zone and on said second conductive zone respectively.

5. Method according to claim 4, wherein said supports are based on at least one composite material, the blind holes being produced by etching this composite material.

6. Method according to claim 1, wherein said step of forming blind holes comprises forming a blind hole passing through the front face of at least one given support from among said supports, said given support having a bottom revealing a conductive zone disposed on a rear face of said given support opposite to said front face of said given support.

7. Method according to claim 1, wherein said blind holes are formed by etching using a laser.

8. Method according to claim 1, wherein said step of forming blind holes is performed so that said blind holes have a splayed shape.

9. Method according to claim 1, wherein said step of forming blind holes is performed so that the second blind hole has a transverse section greater than the transverse section of the first blind hole.

10. Method according to claim 1, wherein said supports are formed from a substrate covered with at least one encapsulation layer based on polymer material.

11. Method according to claim 1, wherein said supports being assembled by means of one or more adhesive bonding layers.

12. Method according to claim 1, wherein said step of forming blind holes includes forming at least one blind hole in the form of a trench producing a closed contour.

* * * * *